United States Patent
Zhou

(10) Patent No.: US 11,652,483 B2
(45) Date of Patent: May 16, 2023

(54) METHOD PROVIDING MULTIPLE FUNCTIONS TO PINS OF A CHIP AND SYSTEM APPLYING THE METHOD

(71) Applicant: Fulian Precision Electronics (Tianjin) Co., LTD., Tianjin (CN)

(72) Inventor: Xiao-Long Zhou, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 84 days.

(21) Appl. No.: 17/515,049

(22) Filed: Oct. 29, 2021

(65) Prior Publication Data
US 2023/0047676 A1 Feb. 16, 2023

(30) Foreign Application Priority Data
Aug. 16, 2021 (CN) .......................... 202110937167.0

(51) Int. Cl.
| | | |
|---|---|---|
| *H03K 19/173* | (2006.01) | |
| *G06F 13/42* | (2006.01) | |
| *H03K 19/17736* | (2020.01) | |
| *H03K 19/17772* | (2020.01) | |
| *H03K 19/23* | (2006.01) | |

(52) U.S. Cl.
CPC ..... *H03K 19/1737* (2013.01); *G06F 13/4282* (2013.01); *H03K 19/17744* (2013.01); *H03K 19/17772* (2013.01); *H03K 19/23* (2013.01)

(58) Field of Classification Search
None
See application file for complete search history.

(56) References Cited

U.S. PATENT DOCUMENTS

2008/0313312 A1* 12/2008 Flynn .................... G06F 13/426
    709/224
2020/0057482 A1* 2/2020 Han ...................... G06F 1/3268

\* cited by examiner

*Primary Examiner* — Anh Q Tran
(74) *Attorney, Agent, or Firm* — ScienBiziP, P.C.

(57) ABSTRACT

A method for providing more than one function to pins of a programmable device used in a server system includes the programmable device and first and second devices. The programmable device is electrically connected to the first device and the second device. The programmable device includes a major logic communication device, a detection module, a storage module, and at least one multiplexing pin. The second device is powered on, sending an in-position signal to the detection module through the at least one multiplexing pin. The detection module transmits the in-position signal to the storage module. The major logic communication module communicates with the first device through the at least one multiplexing pin. A system applying the method are also disclosed.

16 Claims, 3 Drawing Sheets

METHOD PROVIDING MULTIPLE FUNCTIONS TO PINS OF A CHIP AND SYSTEM APPLYING THE METHOD

FIELD

The subject matter herein generally relates to pin utilization, particularly a method and a system for improving a reusability of pins of a programmable device.

BACKGROUND

An FPGA/CPLD pin of a chip in a server controls a power-on timing and logic signals. Logic sources of the chip may be numerous but the number of the FPGA/CPLD pins is insufficient. If the chip is changed to provide more FPGA/CPLD pins, a cost of the chip is increased.

Thus, there is room for improvement in the art.

BRIEF DESCRIPTION OF THE FIGURES

Implementations of the present disclosure will now be described, by way of example only, with reference to the attached figures.

DETAILED DESCRIPTION

Figure 1:
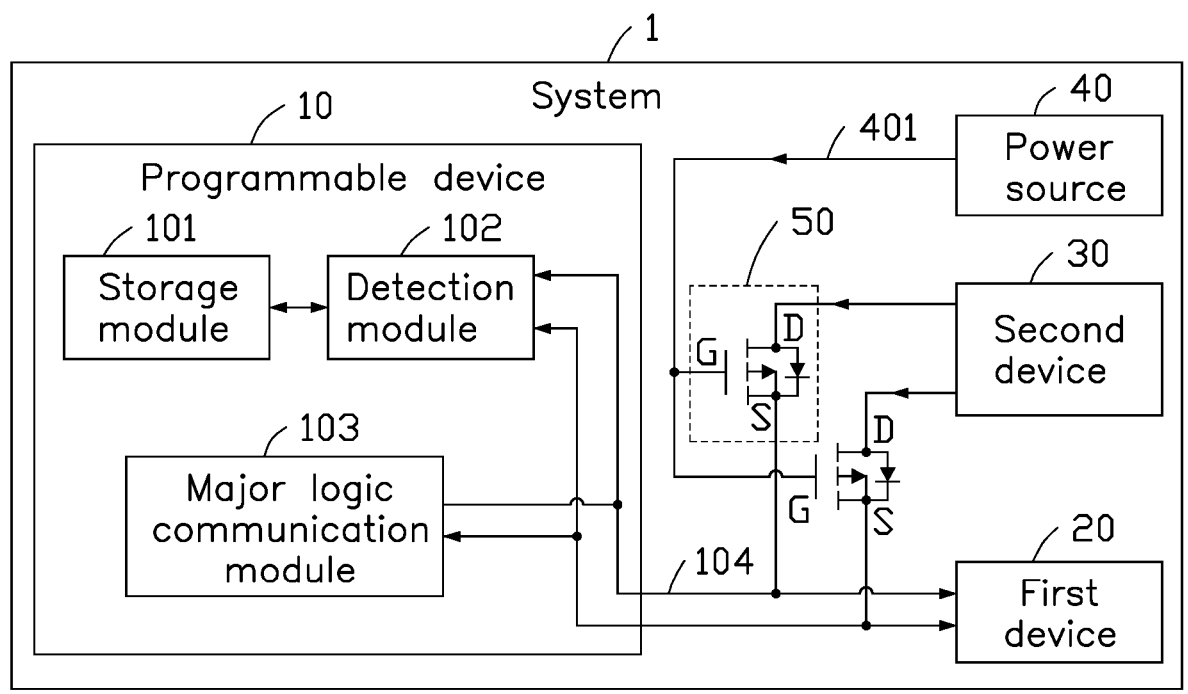
FIG. 1 is a diagram illustrating an embodiment of a system of a server according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides a system of a server for improving and adapting pins of a chip for multiple functions. The system includes a programmable device, a first device, and a second device. The programmable device is electrically connected with the first device and the second device.

The programmable device includes a major logic communication module, a detection module, a storage module, and at least one multiplexing pin. The major logic communication module is electrically connected to the first device through the at least one multiplexing pin. The detection module is connected to the second device through the at least one multiplexing pin. The storage module is electrically connected to the detection module.

The at least one multiplexing pin receives an in-position signal sent from the second device, and transmits the in-position signal to the detection module.

The detection module transmits the in-position signal to the storage module, and the storage module stores the in-position signal.

The major logic communication module communicates with the first device through the at least one multiplexing pin.

The present disclosure provides a method for improving usage and re-usage of pins of a programmable device, used in a system. The system includes a programmable device, a first device, and a second device. The programmable device includes a major logic communication module, a detection module, a storage module, and at least one multiplexing pin. The major logic communication module is electrically connected to the first device through the at least one multiplexing pin. The detection module is connected to the second device through the at least one multiplexing pin. The storage module is electrically connected to the detection module. The method includes following steps:

The second device is powered on to send an in-position signal to the detection module through the at least one multiplexing pin.

The detection module transmits the in-position signal to the storage module.

The major logic communication module communicates with the first device through the at least one multiplexing pin.

Based on the present disclosure, the detection module obtains the in-position signal through the at least one multiplexing pin, the in-position signal is stored in the storage module, the major logic communication module communicates with the first device through the at least one multiplexing pin. Use of the at least one multiplexing pin is extended and improved, and a pin resource is saved.

FIG. 1 shows a system 1 in a server for improving a reusability of pins of a programmable device. The system 1 includes a programmable device 10, a first device 20, and a second device 30. The programmable device 10 is electrically connected to the first device 20 and the second device 30.

The programmable device 10 includes a major logic communication module 103, a detection module 102, a storage module 101, and at least one multiplexing pin 104. The major logic communication module 103 is electrically connected to the first device 20 through the at least one multiplexing pin 104. The detection module 102 is connected to the second device 30 through the at least one multiplexing pin 104. The storage module 101 is electrically connected to the detection module 102.

The at least one multiplexing pin 104 receives an in-position signal sent from the second device 30, and transmits the in-position signal to the detection module 102.

The detection module 102 transmits the in-position signal to the storage module 101, and the storage module 101 stores the in-position signal.

The major logic communication module 103 communicates with the first device 20 through the at least one multiplexing pin 104.

In one embodiment, the major logic communication module 103 is a I2C communication module, and the second device 30 is a device without a hot plug.

The first device 20 can be a I2C device or a central processing unit (CPU), and so on.

Advantages of the I2C communication module are simplicity and effectiveness. Interfaces are directly placed on the I2C communication module, thus, a space taken by the I2C communication module is small for reducing a space taken by the programmable device 10, and a number of the pins in a chip and thus cost is reduced.

I2C communication module includes a data line SDA and a clock line SCL, which work together as a serial bus for sending or receiving data with a I2C device in a bi-directional data transmitting manner.

In related art, the programmable device 10 uses two pins for detecting a device which is not hot-pluggable ("non-hot plug device"), and uses another two pins for communicating with the I2C device, thus there are at least four pins. If the programmable device 10 merely has two pins, when executing the above functions, pin-resources are lacking, therefore, the reusability of the pins is nil.

In the present disclosure, the two multiplexing pins 104 in programmable device 10 are two I/O pins. A first I/O pin and a second I/O pin are electrically connected to the detection module 102, the first I/O pin further is electrically connected to the data line SDA, and the second I/O pin is electrically connected to the clock line SCL.

The non-hot plug device is electrically connected to the first I/O pin and the second I/O pin, and the I2C device is electrically connected to the first I/O pin and the second I/O pin.

The detection module 102 receives the in-position signal through the first I/O pin and the second I/O pin when the non-hot plug device is powered on, and transmits the in-position signal to the storage module 101.

The I2C communication module transmits logic resources to the first I/O pin and the second I/O pin through the data line SDA and the clock line SCL. The first I/O pin and the second I/O pin transmit the logic resource to the I2C device.

In the system 1, the programmable device 10 can use two I/O pins instead of four pins, as in the related art, to achieve same function. Thus, a reusability of the pin in the programmable device is improved, and a pin resource is saved.

The data line SDA and the clock line SCL in the I2C communication module are open-drain pins. When used as normal general purpose input/output (GPIO) pins, the voltages of the pins are instable, and can fail to output high level voltage as normal.

While the I2C communication module communicates with a processor, the first I/O pin and the second I/O pin still receive the in-position signal sent from the non-hot plug device. In the communicating process between the I2C communication module and the processor, a voltage conflict is generated.

In some embodiment, the system 1 further includes a power source 40. A switch circuit 50 is electrically connected between the power source 40 and the first I/O pin or the second I/O pin. For example, the switch circuit 50 is a P channel enhancement mode metal oxide semiconductor (MOS) transistor. The power source 40 is electrically connected to a gate electrode of the MOS transistor, the non-hot plug device is electrically connected to a drain electrode of the MOS transistor, and the first I/O pin and the second I/O pin are electrically connected to a source electrode of the MOS transistor.

During power-on process, the power source 40 outputs a power state signal 401 in a low voltage level, the MOS transistor turns on, the programmable device 10 sets the first I/O pin and the second I/O pin as input pins.

The second device 30 sends the in-position signal to the detection module 102 through the first I/O pin and the second I/O pin. The detection module 102 transmits the in-position signal to the storage module 101. The storage module 101 stores the in-position signal.

When completely powered-on, the power source 40 outputs the power state signal 401 in a high voltage level, and the MOS transistor turns off. The second device 30 stops sending the in-position signal to the detection module 102 through the first I/O pin and the second I/O pin. The programmable device 10 sets the first I/O pin and the second I/O pin as output pins.

The I2C communication module communicates with the first device 20 through the first I/O pin and the second I/O pin. The connection between the power source 40 and the first I/O pin or the second I/O pin is cut off. The first I/O pin and the second I/O pin do not receive a voltage from the power source 40. The I2C communication module communicates with the I2C device through the first I/O pin and the second I/O pin, and the voltage conflict is thereby avoided.

No matter whether the multiplex pins 104 serves as an open-drain output pin or as a push-pull output pin, a voltage conflict between the major logic communication module 103 and the first device 20 is resolved. Further, when the multiplex pin 104 is in the push-pull mode, the circuit structure is more complex.

Figure 2:
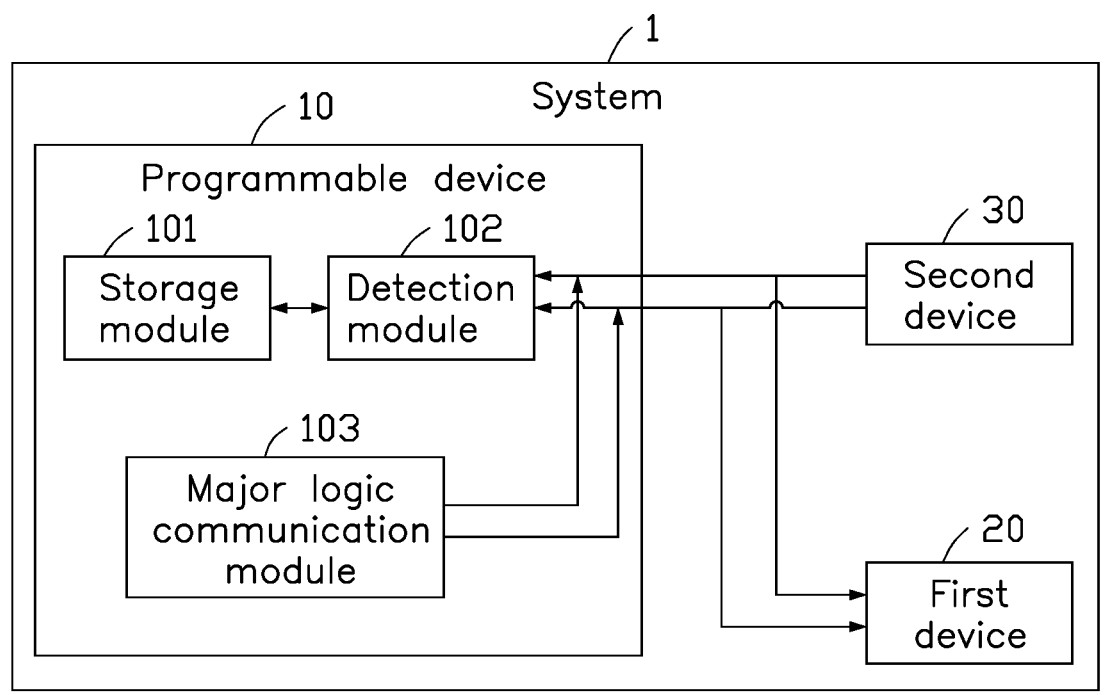
FIG. 2 is a diagram illustrating an embodiment of the second device in a push-pull mode of FIG. 1 according to the present disclosure.

In some embodiments, as shown in FIG. 2, when the multiplex pin 104 in the push-pull mode, the programmable device 10 sets the first I/O pin and the second I/O pin as input pins, and the second device 30 sends the in-position signal to the detection module 102 through the first I/O pin and the second I/O pin.

The detection module 102 transmits the in-position signal to the storage module 101. The storage module 101 stores the in-position signal. Then, the programmable device 10 sets the first I/O pin and the second I/O pin as output pins. The programmable device 10 drives the major logic communication module 103 to communicate with the first device 20 through the first I/O pin and the second I/O pin. The major logic communication module 103 is a frequency reduction module, a power control module, and so on. The major logic communication module 103 can send a frequency reduction signal or a VR enable signal to the first device 20. The present disclosure provides a simple circuit structure.

Figure 3:
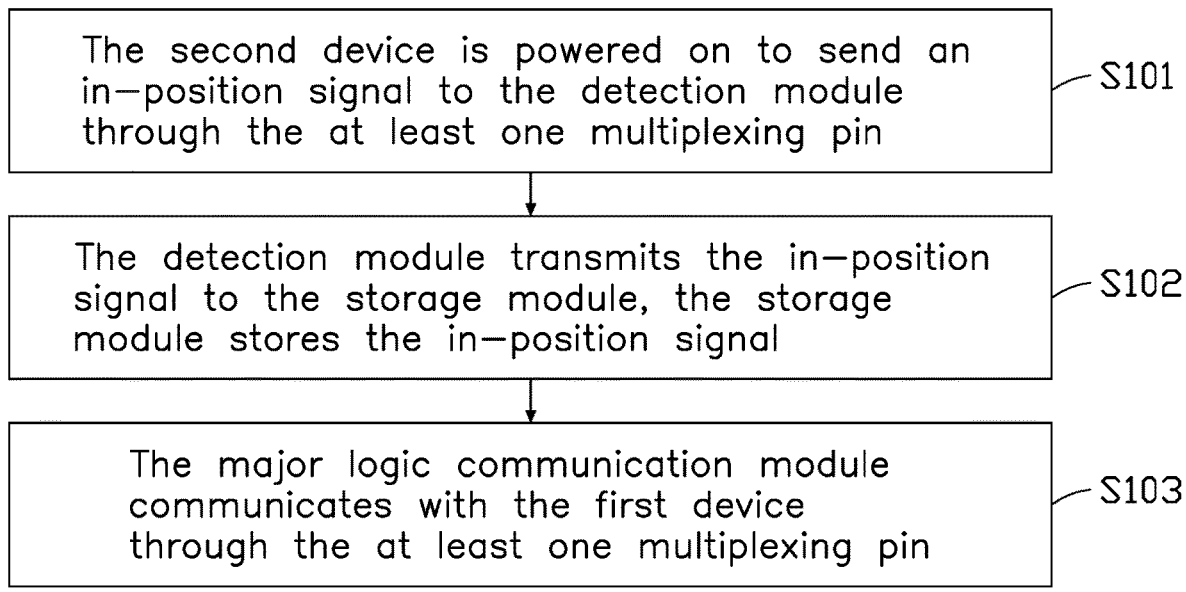
FIG. 3 is a flowchart illustrating an embodiment of method for improving a reusability of pins according to the present disclosure.

The present disclosure further provides a method for improving a reusability of pins of a programmable device in a system. The system includes a programmable device, a first device, and a second device. The programmable device includes a major logic communication module, a detection module, a storage module, and at least one multiplexing pin. The major logic communication module is electrically connected to the first device through the at least one multiplexing pin. The detection module is connected to the second device through the at least one multiplexing pin. The storage module is electrically connected to the detection module. As shown in FIG. 3, the method includes following steps, these steps may be re-ordered:

In block S101, the second device is powered on to send an in-position signal to the detection module through the at least one multiplexing pin.

In block S102, the detection module transmits the in-position signal to the storage module.

In block S103, the major logic communication module communicates with the first device through the at least one multiplexing pin.

In some embodiments, the major logic communication module is a I2C communication module.

In some embodiments, the system further includes a power source. The power source is electrically connected to the at least one multiplexing pins. The power source outputs a power state signal to the at least one multiplexing pins. A switch circuit is electrically connected between the power source and the at least one multiplexing pin.

The method comprises the following further steps, which also may be re-ordered:

During power-on process, the power source outputs the power state signal in a low voltage level, the switch circuit turns on, the programmable device sets the at least one multiplexing pin as input pin.

The second device sends the in-position signal to the detection module through the at least one multiplexing pin. The detection module transmits the in-position signal to the storage module. The storage module stores the in-position signal.

When completely powered on, the power source output the power state signal in a high voltage level, and the switch circuit turns off. The second device stops sending the in-position signal to the detection module through the at least one multiplexing pin. The programmable device sets the at least one multiplexing pin as output pins.

The I2C communication module communicates with the first device through the at least one multiplexing pin.

In some embodiments, when the at least one multiplexing pin is in a push-pull mode, the method includes the following further steps, which may be re-ordered:

The programmable device sets the at least one multiplexing pin as input pins, the second device sends the in-position signal to the detection module 102 through the at least one multiplexing pin.

The detection module transmits the in-position signal to the storage module. The storage module stores the in-position signal.

The programmable device sets the at least one multiplexing pin as output pins. The major logic communication module 103 communicates with the first device through the at least one multiplexing pin.

The programmable device can be a field-programmable gate array (FPGA), or other type of programmable device, a discrete gate or transistor logic device, a discrete hardware component, and so on.

Computer readable program instructions for carrying out the steps of the method herein may be assembler instructions, instruction-set-architecture (ISA) instructions, machine instructions, machine dependent instructions, microcode, firmware instructions, state-setting data, or source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on one computer, partly on the computer, as a stand-alone software package, partly on the first computer and partly on a remote computer or entirely on the remote computer or server. In the latter scenario, the remote computer may be connected to the first computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry to perform embodiments of the present disclosure.

Embodiments of the present disclosure are described herein with reference to flowchart illustrations and/or block diagrams of apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which are executed via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur other than in the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system in a server for improving reusability of pins of a programmable device, the system comprises the programmable device, a first device, and a second device; the programmable device is electrically connected to the first device and the second device; the programmable device comprises a major logic communication device, a detection module, a storage module, and at least one multiplexing pin; the major logic communication module is electrically connected to the first device through the at least one multiplexing pin the detection module is connected to the second device through the at least one multiplexing pin; the storage module is electrically connected to the detection module; the at least one multiplexing pin receives an in-position signal sent from the second device, and transmits the in-position signal to the detection module; the detection module transmits the in-position signal to the storage module; the storage module stores the in-position signal; the major logic communication module communicates with the first device through the at least one multiplexing pin.

2. The system of claim 1, wherein the major logic communication module is a I2C communication module.

3. The system of claim 2, wherein the system further comprises a power source; the power source is electrically connected to the at least one multiplexing pins; the power source outputs a power state signal to the at least one multiplexing pins; a switch circuit is electrically connected between the power source and the at least on multiplexing pin; during powered-on process, the power source outputs the power state signal in a low voltage level, the switch circuit turns on, the programmable device sets the at least one multiplexing pin as input pins; the second device sends the in-position signal to the detection module through the at least one multiplexing pin; the detection module transmits the in-position signal to the storage module; the storage module stores the in-position signal.

4. The system of claim 3, wherein when completely powered-on, the power source output the power state signal in a high voltage level, the switch circuit turns off; the second device stops sending the in-position signal to the detection module through the at least one multiplexing pin; the programmable device sets the at least one multiplexing pin as output pins; the I2C communication module communicates with the first device through the at least one multiplexing pin.

5. The system of claim 3, wherein the at least one multiplexing pin serves as an open-drain pin; the switch circuit comprises a metal oxide semiconductor (MOS) transistor; the power source is electrically connected to the at least one multiplexing pin through the MOS transistor; during powered-on process, the power source outputs the power state signal in the low voltage level, the MOS transistor turns on, the programmable device sets the at least one multiplexing pin as input pins; the second device sends the in-position signal to the detection module through the at least one multiplexing pin; the detection module transmits the in-position signal to the storage module; the storage module stores the in-position signal.

6. The system of claim 5, wherein when completely powered-on, the power source output the power state signal in the high voltage level, the MOS transistor turns off; the second device stops sending the in-position signal to the detection module through the at least one multiplexing pin; the programmable device sets the at least one multiplexing pin as output pins; the I2C communication module communicates with the first device through the at least one multiplexing pin.

7. The system of claim 1, wherein the at least one multiplexing pin serves as a push-pull pin; the programmable device sets the at least one multiplexing pin as an input pin; the second device sends the in-position signal to the detection module through the at least one multiplexing pin; the detection module transmits the in-position signal to the storage module; the storage module stores the in-position signal; then the programmable device sets the at least one multiplexing pin as an output pin; the major logic communication module communicates with the first device through the at least one multiplexing pin.

8. The system of claim 1, wherein the second device is a non-hot plug device.

9. A method implementable in a system of a server for improving reusability of pins of a programmable device, the system comprises the programmable device, a first device, and a second device; the programmable device is electrically connected to the first device and the second device; the programmable device comprises a major logic communication device, a detection module, a storage module, and at least one multiplexing pin; the method comprises:
the second device is powered on to send an in-position signal to the detection module through the at least one multiplexing pin;
the detection module transmits the in-position signal to the storage module; and
the major logic communication module communicates with the first device through the at least one multiplexing pin.

10. The method of claim 9, wherein the major logic communication module is a I2C communication module.

11. The method of claim 9, wherein the system further comprises a power source; the power source is electrically connected to the at least one multiplexing pins; the power source outputs a power state signal to the at least one multiplexing pins; a switch circuit is electrically connected between the power source and the at least on multiplexing pin; the method further comprises:
during powered-on process, the power source outputs the power state signal in a low voltage level, the switch circuit turns on, the programmable device sets the at least one multiplexing pin as input pins; and
the second device sends the in-position signal to the detection module through the at least one multiplexing pin; the detection module transmits the in-position signal to the storage module; the storage module stores the in-position signal.

12. The method of claim 11, wherein the method further comprises:
when completely powered-on, the power source output the power state signal in a high voltage level, the switch circuit turns off;
the second device stops sending the in-position signal to the detection module through the at least one multiplexing pin; the programmable device sets the at least one multiplexing pin as output pins; and
the I2C communication module communicates with the first device through the at least one multiplexing pin.

13. The method of claim 8, wherein when the at least one multiplexing pin serves as an open-drain pin; the switch circuit comprises a metal oxide semiconductor (MOS) transistor; the power source is electrically connected to the at least one multiplexing pin through the MOS transistor; the method further comprises:

during powered-on process, the power source outputs the power state signal in the low voltage level, the MOS transistor turns on, the programmable device sets the at least one multiplexing pin as input pins; and the second device sends the in-position signal to the detection module through the at least one multiplexing pin; the detection module transmits the in-position signal to the storage module; the storage module stores the in-position signal.

14. The method of claim 13, wherein the method further comprises:

when completely powered-on, the power source output the power state signal in the high voltage level, the MOS transistor turns off;

the second device stops sending the in-position signal to the detection module through the at least one multiplexing pin; the programmable device sets the at least one multiplexing pin as output pins; and the I2C communication module communicates with the first device through the at least one multiplexing pin.

15. The method of claim 9, wherein the at least one multiplexing pin serves as a push-pull pin; the method further comprises:

the programmable device sets the at least one multiplexing pin as an input pin; the second device sends the in-position signal to the detection module through the at least one multiplexing pin;

the detection module transmits the in-position signal to the storage module; the storage module stores the in-position signal; and the programmable device sets the at least one multiplexing pin as an output pin; the major logic communication module communicates with the first device through the at least one multiplexing pin.

16. The method of claim 9, wherein the second device is a non-hot plug device.

* * * * *